(12) United States Patent
Wong

(10) Patent No.: US 8,003,945 B1
(45) Date of Patent: Aug. 23, 2011

(54) INTRINSICALLY SAFE NDIR GAS SENSOR IN A CAN

(76) Inventor: Jacob Y Wong, Goleta, CA (US)

( * ) Notice: Subject to any disclaimer, the term of this patent is extended or adjusted under 35 U.S.C. 154(b) by 0 days.

(21) Appl. No.: 12/868,628

(22) Filed: Aug. 25, 2010

(51) Int. Cl.
*G01J 5/02* (2006.01)
(52) U.S. Cl. .................................................. 250/343
(58) Field of Classification Search .................... 250/343
See application file for complete search history.

(56) References Cited

U.S. PATENT DOCUMENTS

| | | | | |
|---|---|---|---|---|
| 5,341,214 | A * | 8/1994 | Wong | 356/437 |
| 5,721,430 | A * | 2/1998 | Wong | 250/339.13 |
| 6,067,840 | A * | 5/2000 | Chelvayohan et al. | 73/23.2 |
| 6,410,918 | B1 * | 6/2002 | Kouznetsov | 250/343 |
| 6,469,303 | B1 * | 10/2002 | Sun et al. | 250/343 |
| 7,180,595 | B2 * | 2/2007 | Willing et al. | 356/437 |
| 7,449,694 | B2 * | 11/2008 | Yi et al. | 250/339.13 |
| 7,541,587 | B2 * | 6/2009 | Cutler et al. | 250/339.13 |
| 7,609,375 | B2 * | 10/2009 | Park | 356/246 |
| 7,796,265 | B2 * | 9/2010 | Tkachuk | 356/437 |
| 2007/0029488 | A1 * | 2/2007 | Wong | 250/341.1 |
| 2007/0200067 | A1 * | 8/2007 | Yoshida | 250/373 |
| 2008/0035848 | A1 * | 2/2008 | Wong | 250/345 |
| 2008/0239322 | A1 * | 10/2008 | Hodgkinson et al. | 356/437 |
| 2008/0308733 | A1 * | 12/2008 | Doncaster | 250/343 |
| 2009/0095918 | A1 * | 4/2009 | Iwase et al. | 250/432 R |
| 2009/0235720 | A1 * | 9/2009 | Smith | 73/31.05 |
| 2010/0134784 | A1 * | 6/2010 | Bitter et al. | 356/51 |
| 2010/0258728 | A1 * | 10/2010 | Wong | 250/339.13 |
| 2011/0042570 | A1 * | 2/2011 | Wong | 250/340 |

* cited by examiner

*Primary Examiner* — David P Porta
*Assistant Examiner* — Christine Sung
(74) *Attorney, Agent, or Firm* — Roy L Anderson; Wagner, Anderson & Bright, P.C.

(57) ABSTRACT

An NDIR gas sensor is housed within a mechanical housing made up of a can and a header housing. The header housing body contains a tunnel waveguide sample chamber. The header housing also has a top surface with a pair of windows formed in it and a signal detector, a reference detector, a MEMS source and a signal processor mounted to it. The can has inner reflective surfaces and the reference detector and the signal detector are affixed to the top surface so that the inner reflective surfaces of the can and the tunnel waveguide sample chamber create a signal channel path length detected by the signal detector that is greater than a reference channel path length detected by the reference detector and an absorption bias between the signal and reference outputs can be used to determine a gas concentration in the sample chamber. Both the signal detector and the reference detector have an identical narrow band pass filter with the same Center Wavelength ("CWL"), Full Width Half Maximum (FWHM) and transmittance efficiency at the CWL.

20 Claims, 5 Drawing Sheets

INTRINSICALLY SAFE NDIR GAS SENSOR IN A CAN

FIELD OF THE INVENTION

The present application is in the field of gas analysis, and specifically relates to apparatus using a Non-Dispersive Infrared (NDIR) gas analysis technique to determine the concentration of a gas of interest that is present in a chamber by sensing the absorption of infrared radiation passing through the gas.

BACKGROUND OF THE INVENTION

We are living in a gaseous world and the type of gases surrounding our everyday life, for example in where we live, work or play, is vital to our well-being, safety, and even our very survival. Exposure to prolonged insufficient oxygen levels (~15% or less) can make us very sick or might even be fatal to us at times.

Too much water vapor in the air surrounding us, especially when the temperature is very high (>90° F.), can make us very uncomfortable or seriously ill. For older folks, exposure to high humidity and very high temperature for prolonged periods of time can even be fatal. Unchecked exposure to, or unintentional breathing of, toxic gases above a certain high concentration level such as Carbon Monoxide (70-400 ppm), Hydrogen Sulfide (50-200 ppm), Formaldehyde etc., (>50 ppb), to name just a few, is extremely hazardous to one's health and often leads to unexpected deaths.

In order to prevent accidental or unintended exposure to unsafe levels of gases, humans have long devised, literally from centuries ago until today, various means of detecting all manners of gases, whether they are actually harmful to them or not. Today one can classify all the significant and still prevalent gas measurement techniques developed to date into two broad categories, namely, interactive and non-interactive types. Among the interactive types are electrochemical fuel cells, tin oxide ($SnO_2$) sensors, metal oxide semiconductor (MOS) sensors, catalytic (platinum bead) sensors, photo-ionization detectors (PID), flame-ionization detectors (FID), thermal conductivity sensors etc., almost all of which suffer from long-term output drifts, short life span and non-specificity problems. Non-interactive types include Non-Dispersive Infrared (NDIR), photo-acoustic and tunable diode laser absorption spectroscopy (TDLAS) gas sensors. Up and coming non-interactive techniques advanced only during the past two decades include the use of the latest micro electromechanical technologies such as MicroElectronic Mechanical Systems (MEMS) and the so-called Nano-technology. However, probably a few more years have to pass before the potential of these new non-interactive type gas sensors is fully obtainable.

With so many gas detection techniques available over the years, one could easily be misled to believe that gas sensors today must be plentiful and readily available to people to avoid harmful exposure to unhealthy or toxic gases. Unfortunately, at the present time, this is far from being the truth. The reasons are constraints arising from sensor performance and sensor cost. As a result, gas sensors today are deployed for safety reasons only in the most critical and needed circumstances. An example can be cited in the case of the kerosene heater. A kerosene heater is a very cost effective and reliable appliance used all over the world for generating needed heat during the winter months. However, it can also be a deadly appliance when used in a space where there is inadequate ventilation. In such a situation, as oxygen is being consumed without adequate replenishment, the oxygen level in the space can drop to a point (<15 volume %) where it is injurious or even deadly to inhabitants if they are not adequately forewarned. Therefore, by law or code most every worldwide locales where kerosene heaters are used, this appliance must be equipped with a low oxygen level alarm sensor. Unfortunately, the lowest unit cost for such a sensor available today is only of the electrochemical type. Even so, the unit cost is still in the range of US $15-20. Furthermore, such a sensor is not even stable over time and has a life span of only 3-5 years, far shorter than the 15-20 years expected for the kerosene heater.

In short, gas sensors available to the public today for use to guard against accidental or unintended exposure to unhealthy or toxic gases are very limited and are invariably inadequate taking into consideration both performance and unit sensor cost. This situation will continue to prevail if no breakthrough gas sensor technology is forthcoming.

Although the Non-Dispersive Infrared ("NDIR") technique has long been considered as one of the best methods for gas measurement, at least from the performance standpoint as being highly specific, sensitive, relatively stable, reliable and easy to maintain and service, it still falls far short of the list of sensor features optimally or ideally needed today. This list of the most desirable gas sensor features will be briefly described below.

The first and foremost desirable feature of a gas sensor to be used for alerting people when they are faced with harmful or toxic gases exceeding a level limit is output stability over time or what is sometimes referred to as having a thermostat-like performance feature. This feature reflects, in essence, the reliability or trust in the use of the sensor. The experience of most people in the use of a thermostat at home is that they are never required, once the sensor is installed, to re-calibrate the sensor and its output stays accurate over time. Such is not the case for gas sensors at the present time. As a matter of fact, no gas sensor today has this desirable feature of having its output stay drift-free irrespective of any measurement technology used for its design and construction.

Gas sensors today have to rely upon periodic re-calibration or output software correction in order to be able to stay drift-free over time. Most recently, the present author advanced in U.S. patent application Ser. No. 12/759,603 a new NDIR gas sensing methodology which renders to first order the output of an NDIR gas sensor designed using this methodology virtually drift-free over time without the need for any sensor output correction software or periodic re-calibration. Thus, it appears hope now exists for the first time for achieving the first and foremost desirable feature of a gas sensor.

The next most desirable feature of a gas sensor is its sensitivity accuracy or its ability to accurately detect the gas of interest to a certain concentration level (e.g., so many ppb or ppm), even in a temperature or pressure hostile environment. Closely related to this feature is detection specificity, namely the capability of a gas sensor to detect the gas of interest free from any interference by other gases in the atmosphere. Another desirable feature of a gas sensor is its ruggedness or its ability to withstand reasonable mechanical abuse (such as a drop from a height of 4-5 feet onto a hard vinyl floor) without falling apart or becoming inoperable. A further desirable feature of a gas sensor is its size and weight, since it is generally desired that such a sensor be small and as light-weight as possible. Yet another desirable feature of a gas sensor is its operating life expectancy (and it is desirable that it have a life span of 15-20 years, or more). Last, but certainly not least, it is desirable that the unit cost of a gas sensor be low enough that it can be affordably applied anywhere. Other than sensor output stability over time, a low unit cost feature is by far the most important desirable feature of a gas sensor, but is also the most difficult to overcome.

It is amply clear that none of the gas sensors available for purchase and use by the general public today meet all of the desirable performance and low unit cost features outlined above. Nevertheless, the long-felt need to have such gas sensors available has not diminished one single iota. The object of the current invention is to advance a novel design for NDIR gas sensors, building upon U.S. patent application Ser. No. 12/759,603 by the present author, such that all the desirable features in sensor performance and sensor unit production cost, hitherto unavailable to the general public, can be attained.

SUMMARY OF THE INVENTION

The present invention is generally directed to a NDIR gas sensor that is housed within a mechanical housing made up of a can and a metal header housing. The header contain a tunnel waveguide sample chamber through its body. The header housing also has a top surface with a pair of windows formed in it and a signal detector, a reference detector, a MEMS source and a signal processor mounted to it. The can has inner reflective surfaces and the reference detector and the signal detector are affixed to the top surface so that the inner reflective surfaces of the can and the tunnel waveguide sample chamber create a signal channel path length detected by the signal detector that is greater than a reference channel path length detected by the reference detector and an absorption bias between the signal and reference outputs can be used to determine a gas concentration in the sample chamber. Both the signal detector and the reference detector have an identical narrow band pass filter with the same Center Wavelength ("CWL"), Full Width Half Maximum (FWHM) and transmittance efficiency at the CWL.

In a first, separate group of aspects of the present invention, the header is sealed to the can so as to create a hermetically sealed environment containing the top surface and the NDIR gas sensor is used to detect carbon dioxide.

In a second, separate group of aspects of the present invention, the microprocessor is a wire-bondable or a surface-mountable Central Processing Unit ("CPU") die which can include a temperature sensor. In addition, a battery, a voltage regulator and an electrical heater die (for regulating the temperature of the header housing) can be mounted to the top surface.

In a third, separate group of aspects of the present invention, each of the reference detector and the signal detector are comprised of a thermopile detector with the identical narrow band pass filter mounted on its top and communicable with an Application Specific Integrated Circuit ("ASIC") such that infrared radiation received by the thermopile detector after passing through the identical narrow band pass filter is converted into a digital signal ready to be transmitted to the microprocessor.

Accordingly, it is a primary object of the present invention to advance a NDIR gas sensor that implements an Absorption Biased methodology for NDIR gas sensors in an intrinsically safe design.

These and further objectives and advantages will be apparent to those skilled in the art in connection with the drawings and the detailed description of the invention set forth below.

DETAILED DESCRIPTION OF THE INVENTION

Figure 1:
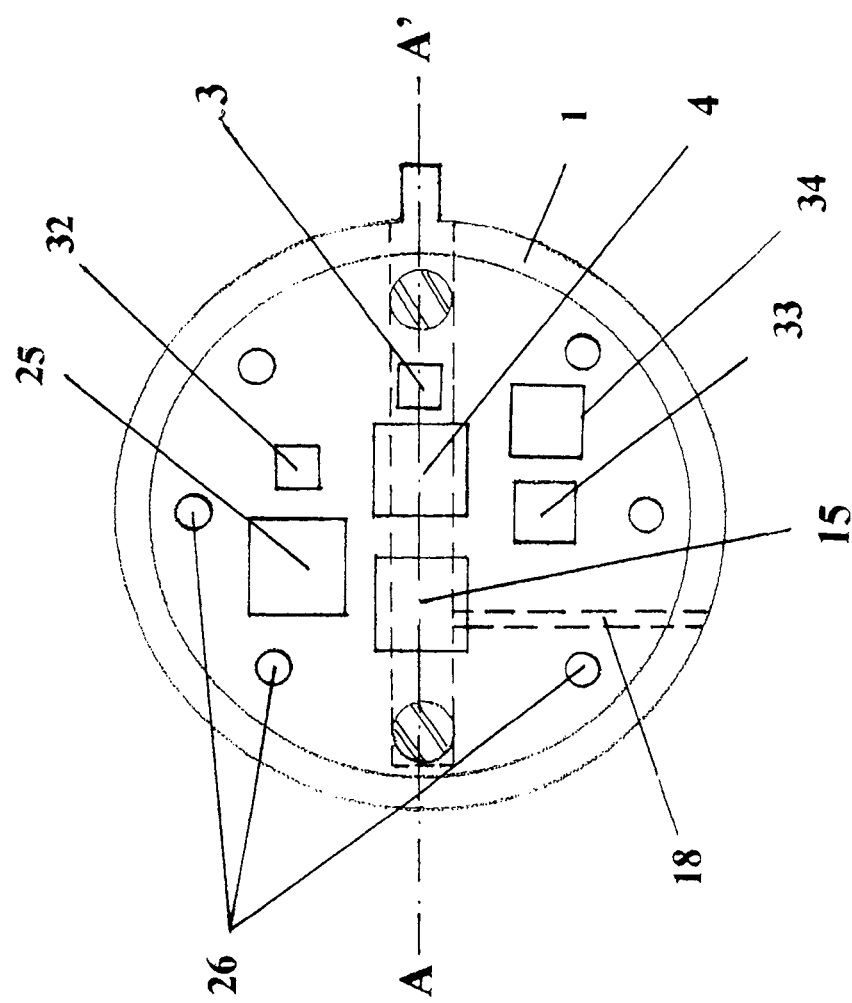
FIG. 1 depicts the placement of all the optoelectronic components of the present invention on top of a detector header forming the bottom half of the sensor housing.

The present invention provides a novel NDIR gas sensor for implementing the recently invented Absorption Biased methodology for NDIR gas sensors described in U.S. patent application Ser. No. 12/759,603, the disclosure of which is specifically incorporated herein by reference. The present invention sets forth an innovative sensor configurational housing combining interactively all the needed optical, mechanical and electronic components together into a functioning NDIR gas sensor occupying typically less than a few cubic centimeters of physical space. Furthermore, a novel NDIR gas sensor design is concomitantly advanced such that all the desirable sensor performance features presented earlier will be satisfied, including unit sensor cost, which can be reduced below what was previously obtainable.

The Absorption Biased methodology for NDIR gas sensors follows the general design principle of a dual-channel implementation, namely a signal and a reference channel working in synchronism as a ratio for signal processing. However, in Absorption Biased methodology both the signal and the reference detectors for the two channels are equipped with an identical narrow bandpass spectral filter having the same Center Wavelength (CWL), Full Width Half Maximum (FWHM) and transmittance efficiency at CWL. Furthermore, both detectors receive infrared radiation from one single source. In order for the methodology to work properly, it is especially preferred that the two separate detectors, with their individual detector element and identical spectral filter, share a common thermal platform because the individual spectral filters are extremely temperature sensitive and sharing a common thermal platform allows these components to track in temperature at all times.

The present invention advances an innovative sensor housing for implementing the so-called Absorption Biased methodology for NDIR gas sensors referred to above and interactively combining all the needed opto-electronic, opto-mechanical and electronic components together into a functioning gas sensor network occupying a physical space not more than just a few cubic centimeters. A mechanical housing unit, used commonly for the packaging of thermopile detectors, has a metallic header ~0.500" in diameter and ~0.150" thick fitted with a metal can typically 0.250" tall that can be welded onto the header for creating a hermetically sealed environment, is used to accommodate all the needed opto-electronic, opto-mechanical and electronic components for constituting a fully functional NDIR gas sensor.

In order to achieve this, all the needed opto-electronic, opto-mechanical and electronic components must be specially designed and fabricated, not only to fit the overall sensor housing for assembly, but also to be able to interact functionally together as a gas sensor unit. There are three such opto-electronic components, namely two Integrated Detector Filter ASIC (IDFA) modules and a MEMS Infrared Source (MIS) module. The IDFA module comprise a thermopile detector with a selectable thin film narrow bandpass filter mounted on top communicable with an Application Specific Integrated Circuit (ASIC) such that infrared radiation received by the detector after passing through the narrow bandpass filter is converted into a digital signal ready to be transmitted to a CPU die for signal processing. The MIS module is simply an infrared MEMS source such that it emits radiation when power is applied to it.

There are also three electronic components that have to be specially designed for the present invention. The first one is a wire-bondable CPU die which can digitally receive, process and output information wired to its input and output pads. Included in this CPU die is also a temperature sensor. The second custom component is a wire-bondable electrical heater die which is used to supply needed heat to temperature regulate the sensor housing if required. The third custom component is a wire-bondable voltage regulator die which translates available input voltage levels to those that are required to power the opto-electronic components (see above), the CPU die and the heater die.

Finally, there are two opto-mechanical components that have to be specially designed for the present invention. The first one is the mechanical housing comprising two separate components, namely, the can and the header of a detector housing typically used to package infrared detectors such as a thermopile. The can is designed to function as mirrors comprising various reflecting surfaces to direct and re-direct radiation above and below the header through openings in the header body covered by optical windows. The body of the header is designed to have tunnels acting as sample chambers for the sensor as radiation is directed downward to and upwards from them through the openings covered by optical windows. These tunnels in the header body are also designed to communicate with the outside air through openings on the side of the header. Covering each of these openings is a thin layer of polyethylene functioning as an air filter in the form of a rubber-band-like ring encircling the edge of the can that is welded onto the header body.

The current invention describes how these specially designed components are assembled together into a mechanical embodiment such as a conventional detector housing to perform functionally as a superb NDIR gas sensor.

However, before further specifics of the present invention are discussed, it is worth noting that the present invention advances a new NDIR gas sensor design that will revolutionize the gas sensor industry by creating an intrinsically safe gas sensor that is essentially explosion-proof that can be used to replace existing electrochemical sensors with an essentially drift-free and detection specific NDIR gas sensor. It is essentially explosion-proof because its source and electronics and power source (if present) are all self-contained within a hermetically sealed environment containing a non-reactive gas, such as nitrogen. Thus, the benefits of NDIR gas sensors can now be obtained in applications in which electrochemical sensors were previously used.

Moreover, gas sensors according to the present invention can be designed to replace current electrochemical sensors that must be replaced on a regular basis. And, in a special advantage of the present invention, it is worth noting that gas sensors according to the present invention can detect carbon dioxide ($CO_2$) whereas electrochemical cells cannot detect $CO_2$ because their end product is $CO_2$. Thus, gas sensors according to the present invention can now be used in many applications in which electrochemical sensors could not function, while still competing with such sensors in terms of cost.

The present invention will now be described in even greater detail by reference to the Figures and an especially preferred embodiment of the present invention. Although the Figures are described in greater detail below, the following is a glossary of the elements identified in the Figures.

Figure 2:
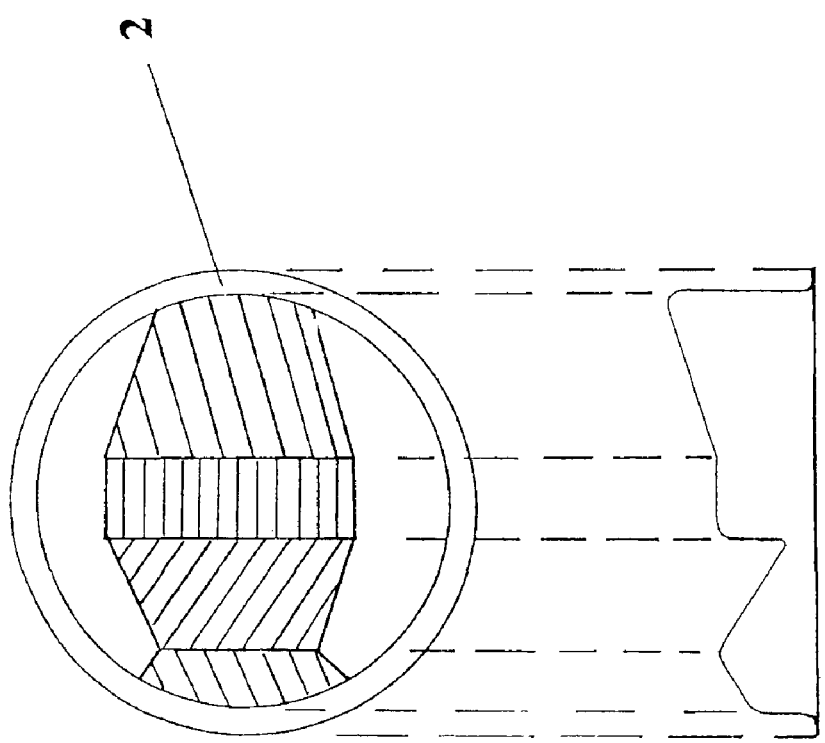
FIG. 2 depicts schematically the detector can of FIG. 1 with its custom reflecting surfaces impregnated inside its top constituting the top half of the sensor housing of the present invention.
Figure 3:
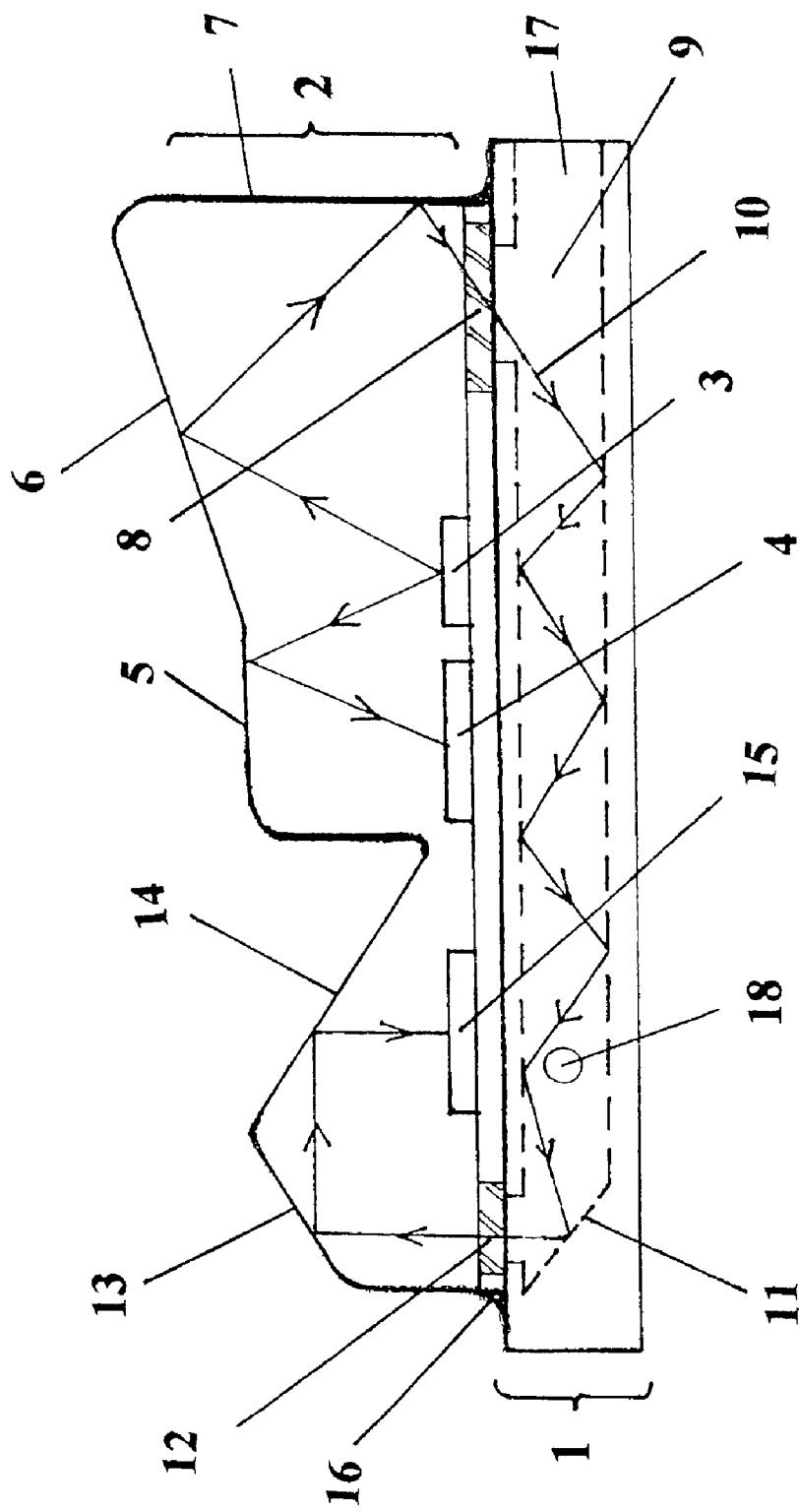
FIG. 3 depicts a cross-sectional view of the sensor housing along AA' of FIG. 1 when the top half and the bottom half of the sensor housing are welded together to form the entire body of a fully functional NDIR gas sensor.

1 detector header housing
2 detector can
3 MEMS module
4 detector module
5 reflecting surface (in the Reference channel)
6 reflecting surface
7 reflecting surface
8 window
9 tunnel waveguide sample chamber
10 radiation
11 mirror
12 window
13 reflecting surface
14 reflecting surface
15 detector module
16 welding joint
17 tunnel opening
18 port opening
19 thermopile detector
20 narrow bandpass interference filter
21 Application Specific Integrated Circuit ("ASIC")
22 infrared radiation
23 wire bondable pad
24 surface mountable pad
25 platinum film
26 lead
27 platinum film
28 heater resistive structure
29 thin $Si_3N_4$ membrane
30 silicon substrate cavity structure
31 wire bondable pad
32 wire bondable voltage regulator die
33 heater die
34 battery FIG. 1 shows the placement and arrangement of all the optoelectronic components on top of the detector header housing 1 forming the bottom half of the sensor assembly for the current invention. FIG. 2 shows schematically the detector can 2 with its reflecting surfaces impregnated inside its top constituting the top half of the sensor assembly of the present invention. FIG. 3 depicts a cross-sectional view of the sensor assembly (along AA' of FIG. 1) of the current invention when the detector can 2 (see FIG. 2) is welded to the detector header 1 (see FIG. 1) forming the entire body of a fully functioning NDIR gas sensor.

With reference to FIG. 3, part of the infrared radiation emanating from the MEMS module 3 (see also FIG. 1) is reflected onto detector module 4 via reflecting surface 5 constituting the Reference channel of the currently invented NDIR gas sensor. Another part of the infrared radiation emanating from MEMS module 3 enters via reflecting surfaces 6 and 7 and also window 8 (see FIG. 3) into the tunnel waveguide sample chamber 9 of the detector header housing 1 constituting the Signal channel of the currently invented NDIR gas sensor. The radiation 10 propagating inside the tunnel sample chamber 9 emerges at the other end via a 45° mirror 11, formed inside the tunnel, and window 12. The emerging radiation 10 is directed by reflection surfaces 13 and 14 of the detector can housing 2 onto detector module 15. The formation of the Reference and Signal channels by the optoelectronic and optomechanical components of the present invention follows the teaching of the Absorption Biased methodology for NDIR gas sensors as disclosed in U.S. application Ser. No. 12/759,603 by the present author.

As can be seen from FIG. 3, since the space between the detector can housing 2 and the detector header housing 1 is sealed off from the ambience by the welding joint 16 (see FIG. 3) and windows 8 and 12 and is filled with 100% Nitrogen, the Reference channel does not feel any effect from ambient $CO_2$ present in the tunnel sample chamber 9 which is in communication with the ambience outside through openings 17 and 18. (Opening 17 is a channel opening shown in FIG. 1 while opening 18 is a port opening shown in FIG. 3.) On the other hand, infrared radiation emanated by the MEMS module 3 for the Signal channel passes through the tunnel sample chamber 9 prior to reaching detector module 15. Therefore the Signal channel is sensitive to the presence of any $CO_2$ gas in the surrounding ambience which is in communication with the tunnel sample chamber 9 via openings 17 and 18.

Figure 4:
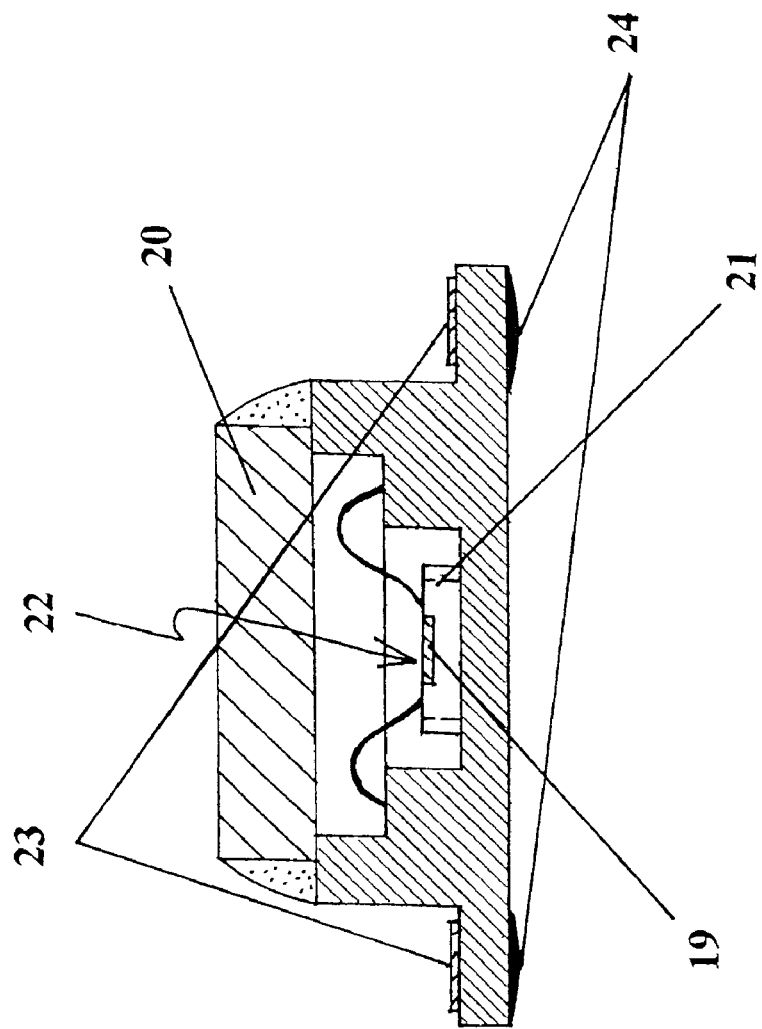
FIG. 4 depicts the detail for the construct of the detector module which is a digital sensor device comprising a thermopile detector, a narrow bandpass interference filter and an Application Specific Integrated Circuit (ASIC) electrically integrated together as a functioning unit.

The roles played by the optoelectronic components for performing the signal processing function of the currently invented NDIR gas sensor will now be described. With reference to FIG. 1, Detector module 4 of the Reference channel and Detector module 15 of the Signal channel are identical devices. Such a detector module is in essence a digital sensor designed to be a surface mountable or wire bondable integrated circuit device comprising a thermopile detector 19, a narrow bandpass interference filter 20 fabricated on top and an Application Specific Integrated Circuit (ASIC) 21 all electrically interconnected as depicted in FIG. 4. With reference to FIG. 4, infrared radiation 22 incident on the thermopile detector 19 after passing through the filter 20 will be processed by ASIC 21 with the resulting signal available digitally for further processing elsewhere via wire bondable pads 23 or surface mountable pads 24. Thus both the Reference channel and the Signal channel signals are processed respectively by Detector modules 4 and 15 with the resulting signals forwarded to a wire bondable CPU die 25 (see FIG. 1) for further processing. The final outputs of the gas sensor are transmitted to the outside world from the CPU die 25 through 2 or more leads 26 of the detector header housing 1 (see FIG. 1).

Figure 5:
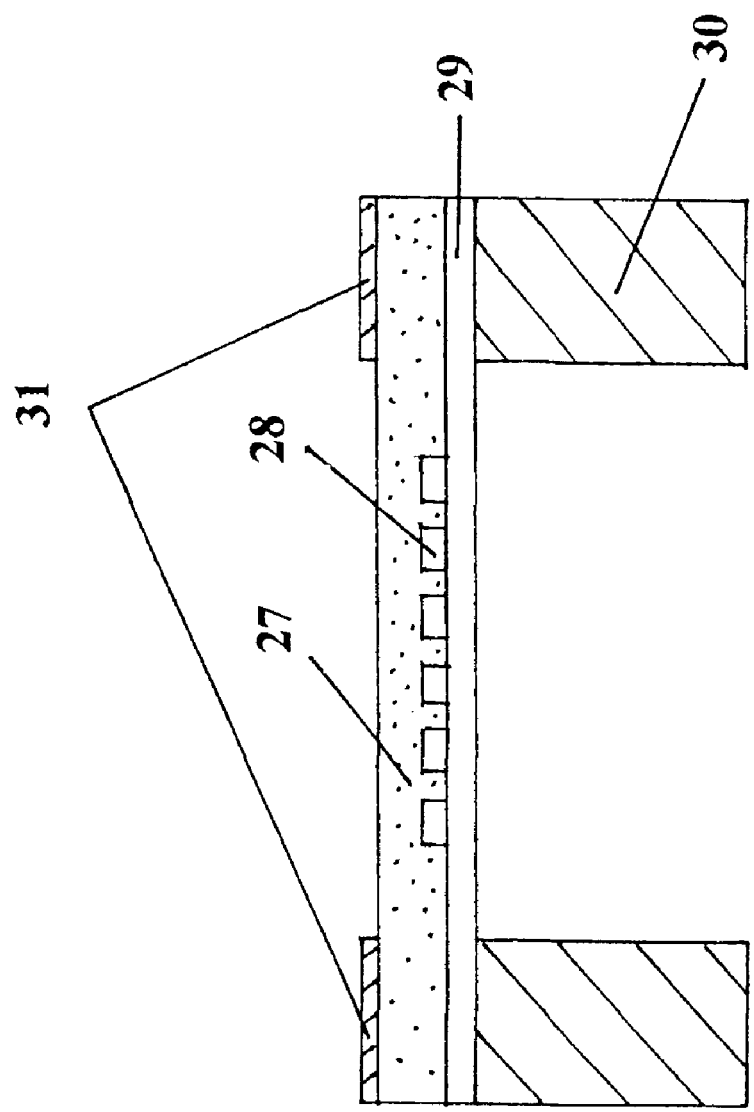
FIG. 5 depicts the detail of the MEMS module which is basically an all solid-state micro hot plate fabricated on a thin micro-machined membrane supported by a silicon cavity structure.

The MEMS module 3, as depicted in FIG. 1, is a wire bondable microelectronic device which acts as the source of infrared radiation for the currently invented gas sensor as depicted in FIG. 5. Basically it is an all solid state micro hot plate fabricated on a thin micro-machined membrane. A high emissivity layer of black platinum film 27 is deposited onto a heater resistive structure 28 supported by a thin $Si_3N_4$ membrane 29 which is part of a silicon substrate cavity structure 30 as shown in detail in FIG. 5. When voltage is applied through the wire bondable pads 31, the heater resistive structure 28 gets hot very quickly and depending upon how much and how long voltage is applied to the device, the heater resistive structure 28 acts like a near perfect blackbody source with emissivity approaching unity. As shown in FIG. 3, infrared radiation from the MEMS module 3 is directed via the reflecting surfaces of detector can housing 2 to detector modules 4 and 15 constituting, respectively, the Reference and Signal channels of the currently invented ZD NDIR gas sensor fuse. It should be noted that the reflectivity of reflecting surfaces of detector can housing 2 can be enhanced, if desirable, by known means such as deposition of metals (e.g., chrome or gold). Similarly, the reflectivity of tunnel sample chamber 9 can also be enhanced in the same fashion, or only it may be so enhanced, depending upon the needs of a particular gas sensor made in accordance with the teaching of the present invention.

All voltages needed to drive the optoelectronic components mounted on the detector header housing 1 are derived from a wire bondable voltage regulator die 32 (see FIG. 1). Voltage regulator die 32 is fed by an external voltage source via leads 26 of the detector header housing 1. The output from the voltage regulator die 32 is first connected to the CPU die 25 which then supplies the other optoelectronic components, viz. detector modules 4 and 15, the MEMS module 3 and also a heater die 33 (see FIG. 1) which could be used to regulate the internal temperature of the space between the detector header housing 1 and the detector can housing 2. In addition to receiving power from the CPU die 25, the heater die 33 is also directly controlled by the CPU dies 25. In an optional embodiment, such as when it is desired that a power source be self-contained within the gas sensor, a battery 34 can be mounted on the detector header housing 1 as shown in FIG. 1.

While the invention has been described herein with reference to a preferred embodiment, this embodiment has been presented by way of example only, and not to limit the scope of the invention. Additional embodiments thereof will be obvious to those skilled in the art having the benefit of this detailed description. Further modifications are also possible in alternative embodiments without departing from the inventive concept.

Accordingly, it will be apparent to those skilled in the art that still further changes and modifications in the actual concepts described herein can readily be made without departing from the spirit and scope of the disclosed inventions.

What is claimed is:

1. A Non-Dispersive Infrared ("NDIR") gas sensor for detecting the presence of a chosen gas, comprising:
    a mechanical housing comprising:
        a can having a plurality of inner reflective surfaces; and
        a header housing affixed to the can having a top surface with a pair of windows formed in the top surface and containing a tunnel waveguide sample chamber in its body;
    a Microelectronic Mechanical System ("MEMS") source affixed to the top surface that emits radiation when power is applied to it;
    a reference detector that produces a reference output;
    a signal detector that produces a signal output; and
    a microprocessor that receives the reference output and the signal output;
    wherein each of the reference detector and the signal detector have an identical narrow band pass filter with the same Center Wavelength ("CWL"), Full Width Half Maximum (FWHM) and transmittance efficiency at the CWL; and
    wherein the reference detector and the signal detector are affixed to the top surface so that the plurality of inner reflective surfaces and the tunnel waveguide sample chamber create a signal channel path length detected by the signal detector that is greater than a reference channel path length detected by the reference detector.

2. The NDIR gas sensor of claim 1, wherein the header is sealed to the can so as to create a hermetically sealed environment containing the top surface.

3. The NDIR gas sensor of claim 2, wherein the chosen gas is carbon dioxide.

4. The NDIR gas sensor of claim 1, wherein the microprocessor is a surface mountable Central Processing Unit ("CPU") die.

5. The NDIR gas sensor of claim 1, wherein the microprocessor is a wire-bondable Central Processing Unit ("CPU") die.

6. The NDIR gas sensor of claim 1, wherein the microprocessor further comprises a temperature sensor.

7. The NDIR gas sensor of claim 6, further comprising an electrical heater die affixed to the top surface for supplying heat to regulate the temperature of the header housing.

8. The NDIR gas sensor of claim 7, further comprising a voltage regulator affixed to the top surface.

9. The NDIR gas sensor of claim 1, further comprising a battery affixed to the top surface.

10. The NDIR gas sensor of claim 1, wherein each of the reference detector and the signal detector are further comprised of a thermopile detector with the identical narrow band pass filter mounted on its top and communicable with an Application Specific Integrated Circuit ("ASIC") such that infrared radiation received by the thermopile detector after passing through the identical narrow band pass filter is converted into a digital signal ready to be transmitted to the microprocessor.

11. The NDIR gas sensor of claim 1, wherein the signal channel path length is sufficiently greater than the reference channel path length so that the electronics can use an absorption bias between the signal output and the reference output to determine the chosen gas concentration in the sample chamber.

12. A Non-Dispersive Infrared ("NDIR") gas sensor for detecting the presence of a chosen gas, comprising:
   a Central Processing Unit ("CPU");
   a first and a second Integrated Detector Filter ASIC module ("IDFA"), each of which is comprised of a thermopile detector with an identical narrow bandpass filter mounted on top and communicable with an Application Specific Integrated Circuit ("ASIC") such that infrared radiation received by the thermopile detector after passing through the identical narrow bandpass filter is converted into a digital signal ready to be transmitted to the CPU;
   a mechanical housing comprising:
      a can having a plurality of inner reflective surfaces; and
      a header housing affixed to the can having a top surface with a pair of windows formed in the top surface and containing a tunnel waveguide sample chamber in its body; and
   a Microelectronic Mechanical System ("MEMS") source mounted to the top surface that emits radiation when power is applied to it;
   wherein the first and the second IDFA are affixed to the top surface so that the plurality of inner reflective surfaces and the tunnel waveguide sample chamber create a signal channel path length detected by the first IDFA that is sufficiently greater than a reference channel path length detected by the second IDFA so that the CPU can use an absorption bias between a signal output of the first IDFA and a reference output of the second IDFA to determine the chosen gas concentration in the sample chamber.

13. The NDIR gas sensor of claim 12, wherein the header is sealed to the can so as to create a hermetically sealed environment containing the top surface.

14. The NDIR gas sensor of claim 13, wherein the chosen gas is carbon dioxide.

15. The NDIR gas sensor of claim 14, further comprising an electrical heater die attached to the top surface for supplying heat to regulate the temperature of the header housing.

16. The NDIR gas sensor of claim 15, further comprising a voltage regulator affixed to the top surface.

17. The NDIR gas sensor of claim 16, further comprising a battery affixed to the top surface.

18. The NDIR gas sensor of claim 17, wherein the CPU is a surface-mountable Central Processing Unit ("CPU") die.

19. The NDIR gas sensor of claim 17, wherein the CPU is a wire-bondable Central Processing Unit ("CPU") die.

20. The NDIR gas sensor of claim 19, wherein the wire-bondable CPU die further comprises a temperature sensor.

* * * * *